(12) United States Patent
Cheng et al.

(10) Patent No.: US 6,350,626 B1
(45) Date of Patent: Feb. 26, 2002

(54) METHOD OF TESTING ELECTROMIGRATION LIFETIME

(75) Inventors: Donald Cheng; Kuan-Yu Fu, both of Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/410,393

(22) Filed: Oct. 1, 1999

(51) Int. Cl.$^7$ .................................................. H01L 21/66
(52) U.S. Cl. ................................................ 438/14; 364/490
(58) Field of Search .......................... 438/14, FOR 142; 364/490

(56) References Cited

U.S. PATENT DOCUMENTS 5,760,595 A * 6/1998 Edwards et al.
5,801,394 A * 9/1998 Isobe
6,100,101 A * 8/2000 Marathe et al.
6,136,619 A * 10/2000 Ceuninck et al.

* cited by examiner

Primary Examiner—George Fourson
Assistant Examiner—Joannie Adelle Garcia
(74) Attorney, Agent, or Firm—Charles C. H. Wu; Charles C. H. Wu & Associates

(57) ABSTRACT

A method of testing EM lifetime has following steps. First, a pre-characterizing step is performed to obtain parameters such as $T_C$(the critical temperature,), Wc (the critical line width), $Q_{GB}$(the activation energy of grain boundary diffusion) and $Q_L$(the activation energy of lattice diffusion) of a metal prior to the use of the test methodology for a new technology. Next, whether a real line width (W) of the metal is narrower or wider than $W_C$ is determined. For the narrower line widths, the diffusion mechanism is dominated by the Lattice diffusion only and corresponds to single activation energy ($Q_L$). A WLR isothermal test with a relatively high temperature, such as 400° C., can be implemented to reduce the test time to as short as a few seconds. The EM lifetime ($t_{50}$) under normal operating condition can be directly obtained by conversion from $T_{test}$ to $T_C$ by using $Q_L$.

9 Claims, 3 Drawing Sheets

METHOD OF TESTING ELECTROMIGRATION LIFETIME

BACKGROUND OF THE INVENTION

1. Field of Invention

The present invention relates to a method of testing electromigration (EM) lifetime. More particularly, the present invention relates to a test methodology for fast wafer-level reliability (FWLR).

2. Description of Related Art

Reliability of metal interconnections become increasingly important with decreasing cross section area and increasing current density. EM (Electromigration) has been one of the most important reliability issues because it can cause open or short circuits in integrated circuit interconnects under normal operation conditions, resulting in circuit failure.

Conventional EM lifetime testing is performed in an oven at some elevated temperature with an adequately high current density passing through the test lines. In general, this kind of package-level testing can take weeks or even months to complete and hence it is difficult to provide fast feedback for new process development or routine monitor for statistical process control. As a result, fast EM tests performed at the wafer level are receiving great interest in industry. In addition, large current density and high temperature are employed in order to achieve the short testing time. The current density is in the order of 10 MA/cm$^2$ and temperature is higher than 300° C. Accordingly, a high amount of heat is generated and hence adds uncertainties and unintended effects to the EM tests.

Various WLR (Wafer-Level Reliability) EM tests have been proposed such as SWEAT(Standard Wafer-Level Electromigration Acceleration Test), BEM (Breakdown Energy of Metals), 1/f noise measurement and an isothermal test, in order to reduce the testing time and accurately control the heat. However, the conventional test techniques stated above fail to model EM lifetime in terms of microstructural characteristics of interconnects, such as line width and line temperature. It is important to model EM lifetime when attempting to understand and thus quantitatively describe the physical phenomena in various stressful conditions. Without modeling, WLR is difficult to develop or at its best can only be used as process monitor.

SUMMARY OF THE INVENTION

Accordingly, this invention provides a method of testing EM lifetime, which can be used under different conditions of line width and temperatures. Thus, a high temperature, fast wafer-level reliability (FWLR) test is achieved.

This invention provides a full understanding of EM diffusion mechanism over a wide range of line widths and temperatures. Hence, this invention provides a method for testing the EM lifetime of a metal having a specific critical line width and a specific critical temperature under different conditions of line widths and temperatures.

The method of testing EM lifetime according to this invention comprises following steps. A pre-characterizing step is performed to obtain parameters comprising $T_C$ (critical temperature,), $W_C$ (critical line width), $Q_{GB}$ (activation energy of grain boundary diffusion) and $Q_L$ (the activation energy of lattice diffusion) of a metal prior to the use of the test methodology for a new technology. The pre-characterizing step is not necessary if the above parameters are known.

A $t_{50test}$ value is obtained by a WLR isothermal test at a relatively high temperature ($T_{test}$), such as 400° C., which is higher than $T_C$, can be implemented to reduce the test time to as little as a few seconds.

Whether a real line width (W) of the metal is narrower or wider than Wc is determined. For the wider line widths (i.e., $W>W_C$), the diffusion mechanism can be dominated by either lattice diffusion (for $T>T_C$) or grain boundary diffusion (for $T<T_C$) which corresponds to two different activation energies ($Q_L$ and $Q_{GB}$). The EM lifetime ($t_{50}$) under normal operation condition ($T_{use}$) can be obtained by conversion from $T_{test}$ to $T_{use}$ by using the equation (1a) and (1b).

For the narrower line widths,( i.e., $W<W_C$), the diffusion mechanism is dominated by the lattice diffusion only and corresponds to single activation energy ($Q_L$). The EM lifetime ($t_{50}$) under normal operating condition ($T_{use}$) can be directly obtained by conversion from $T_{test}$ to $T_{use}$ by using equation (2).

The equation (1a), (1c), and (2) is shown as follow:

When $W>W_C$, $$t_{50use} = t_{test}\left(\frac{j_{use}}{j_{test}}\right)^{-n} \exp\left(\frac{Q_L}{k}\left(\frac{1}{T_{use}} - \frac{1}{T_{test}}\right)\right) \text{ for } T > T_C; \quad (1a)$$

$$t_{50use} = t_{test}\left(\frac{j_{use}}{j_{test}}\right)^{-n} \exp\left(\frac{Q_{GB}}{k}\left(\frac{1}{T_{use}} - \frac{1}{T_C}\right) - \frac{Q_L}{kT}\left(\frac{1}{T_C} - \frac{1}{T_{test}}\right)\right) \quad (1c)$$

$$\text{for } T < T_C;$$

When $W \leq W_C$, $$t_{50use} = t_{test}\left(\frac{j_{use}}{j_{test}}\right)^{-n} \exp\left(\frac{Q_L}{k}\left(\frac{1}{T_{use}} - \frac{1}{T_{test}}\right)\right) \quad (2)$$

$t_{test}$ and $T_{50use}$ represent the EM lifetime for testing temperature and a normal operation temperature, respectively. $Q_{GB}$ and $Q_L$ are the activation energies for grain boundary diffusion and lattice diffusion, respectively n is the constant which describes the current density j dependence and the fundamental physical arguments support n=2, and A is the proportionality constant which depends on the technology.

As embodied and broadly described herein, the metal can be Cu or Al. For example, the critical temperature of Al metal is about 390. For a 0.25 μm process, the critical line width is about 1 μm. The $Q_L$ and the $Q_{GB}$ of the Al metal are about 1.05 eV and 0.60 eV, respectively.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The failure process of EM is described as a cumulative effect of the resistance change of the thin film metal interconnects, which are considered to consist of two types of line segments: the poly-grain and the single train segments. In general, the diffusion mechanism of EM in the single grain segments is dominated by lattice diffusion, since there is no transport path constituted by grain boundaries along the line. In contrast, the diffusion mechanism will be different at different temperatures in poly-grain segments. At a low temperature, the effective diffusion ability in the lattice is infinitely small when compared with that from the grain boundary, so the grain boundary diffusion becomes a dominant mode at low temperatures. The diffusion mechanism becomes lattice diffusion dominated at high temperature due to the much higher effective diffusion in the lattice. There exists a critical temperature, $T_C$, such that the effective diffusion abilities in the grain boundary and the lattice are equal. For wider line widths, the line is primarily comprised of poly-grain segments. From the aforementioned, the grain boundary diffusion is the dominant diffusion mechanism below $T_C$. While the lattice diffusion is the dominant diffusion mechanism above $T_C$ for wider lines, as the line width decreases, the line becomes quasi-bamboo or bamboo structure and thus only a few grain boundaries along the line direction possibly exist. The line is comprised primarily of single-grain segments and hence only the lattice diffusion is responsible for the diffusion mechanism, regardless of the temperature.

Based on what described above, following physical model for EM lifetime in metal lines is propoesed. Regardless of which diffusion mechanism (lattice or grain boundary) is dominant, it is well known that the median failure time ($t_{50}$) can be cast in the following form of the Black formula:

$$t_{50} = Aj^{-n}\exp\left(\frac{Q}{kT}\right), \quad (3)$$

where Q is the activation energy which represent the responsible diffusion mechanism which in turn depends on the temperature and line width of the metal line, n is the constant related to the current density (j) and fundamental physical argument support n=2, and A is the proportionality constant which depends on the technology.

Figure 1:
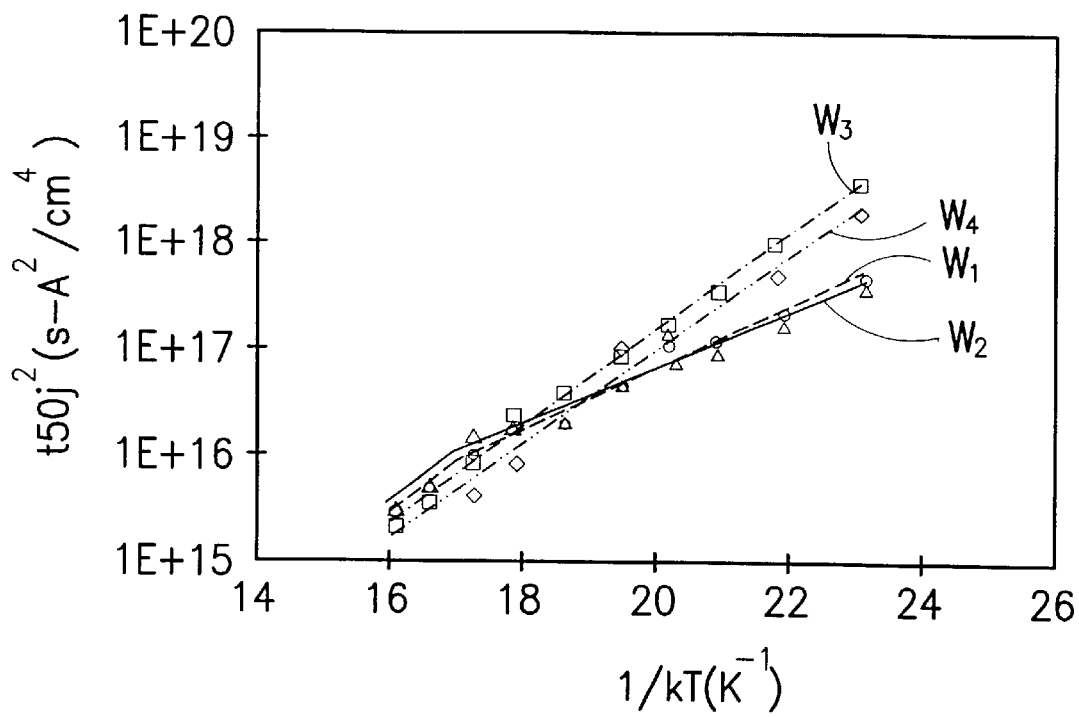
FIG. 1 is an Arrhenius plot of $t_{50}j^2$ vs. 1/kT under the isothermal test for W=0.32 μm, 1.0 μm, 2.0 μm, and 4.0 μm.

FIG. 1 shows the Arrhenius plot for W=0.32 μm, 1.0 μm, 2.0 μm and 4.0 μm, where W is line width of metal, for example Al. As shown in FIG. 1, curves W1, W2, W3 and W4 represent metal width of 4 μm, 2 μm, 1 μm, and 0.32 μm, respectively. It can be seen that only one diffusion mechanism (identified as lattice diffusion) exists for smaller line widths (W3 and W4), whereas, for larger line widths (W1 and W2), two diffusion mechanisms (identified as lattice and grain boundary diffusions) exist and critical temperature ($T_C$) which divides the diffusion regions. $T_C$ is roughly about 390° C. for Al. It seems there exists a "gray area" between 1.0 μm and 1.2 μm in which how the diffusion mechanism changes from 2 to 1 diffusion mechanism-dominant is not clear. For simplicity, we assume the transition occurs abruptly at a line width W=$W_C$. According to real experimental results, $W_C$ is between 1.0 and 1.2 μm for Al. We therefore set $W_C$=1.0 μm as a more conservative approach.

According to the data shown in the FIG. 1, a proposal that the diffusion mechanism in EM changes with the line width and the test temperature is given. When the line width (W) is smaller than a critical width ($W_C$), the diffusion mechanism is described by the lattice diffusion regardless of the test temperature. The diffusion mechanism, however, is dependent on the test temperature ($T_{test}$) when the line width is larger than $W_C$. If the test temperature is below $T_C$, the grain boundary diffusion dominates, but the diffusion mechanism is controlled mainly by the lattice diffusion when the test temperature is above $T_C$. Based on the aforementioned, EM lifetime ($t_{50}$) can be expressed by the following forms over the various regions of the 2-dimensional (T–W) space:

When W>Wc, $$t_{50} = t_{GB} = Aj^{-n}\exp\left(\frac{Q_{GB}}{k}\left(\frac{1}{T} - \frac{1}{T_C}\right)\right) \text{ for } T < T_C; \quad (4a)$$

$$t_{50} = t_L = Aj^{-n}\exp\left(\frac{Q_L}{k}\left(\frac{1}{T} - \frac{1}{T_C}\right)\right) \text{ for } T > T_C; \quad (4b)$$

$$t_{50} = t_L = Aj^{-n}\exp\left(\frac{Q_L}{k}\left(\frac{1}{T} - \frac{1}{T_C}\right)\right) \quad (5)$$

$t_{GB}$ and $t_L$ represent the EM lifetime for grain boundary diffusion and lattice diffusion, respectively. $Q_{GB}$ and $Q_L$ are the activation energies for grain boundary diffusion and lattice diffusion, respectively. n is the constant related to the current density j and fundamental physical argument support n=2, while A is the proportionality constant which depends on the technology. Note that $t_{GB}$=$t_L$ when T=$T_C$ in Eqs. (4a) and (4b), which shows that $T_C$ is the critical temperature at which the EM lifetime under the lattice and the grain boundary diffusion are equal.

Figure 2:
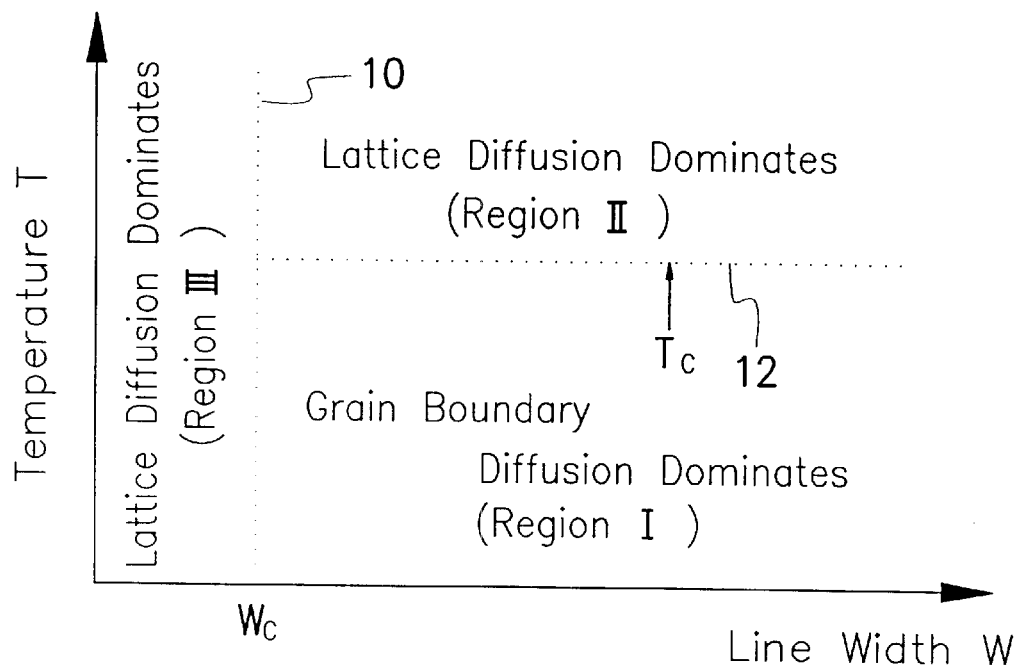
FIG. 2 shows the various regions of theoretical 2-dimension (T–W) space.

Based on Eqs. (4a), (4b) and (5), one can illustrate the different diffusion dominant regions on the two-dimensional (T–W) space as shown in FIG. 2. The physical model has been verified experimentally as supported by FIG. 3 which is obtained by using experimental data for Al.

Figure 3:
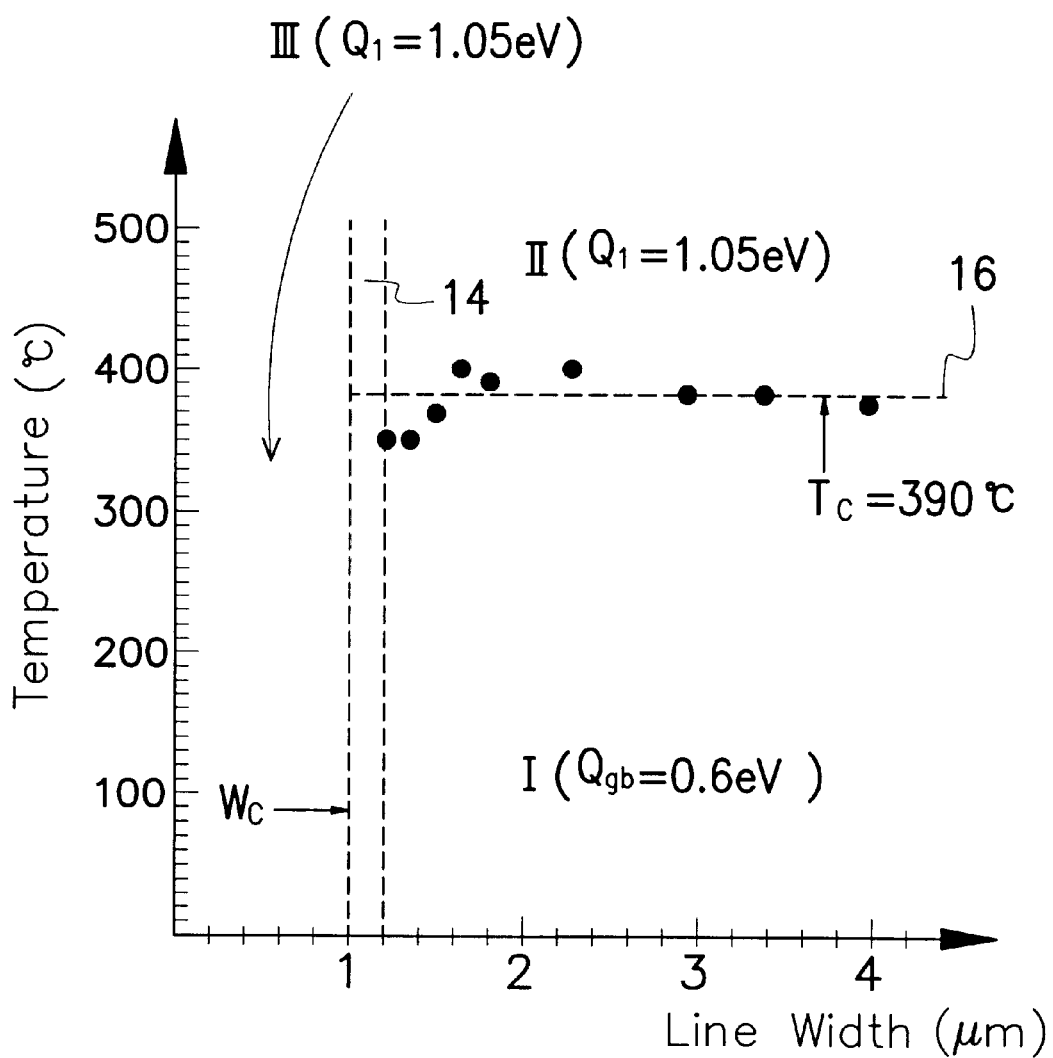
FIG. 3 shows the various regions of the experimental 2-dimensional (T–W) space of Al metal.
Figure 4:
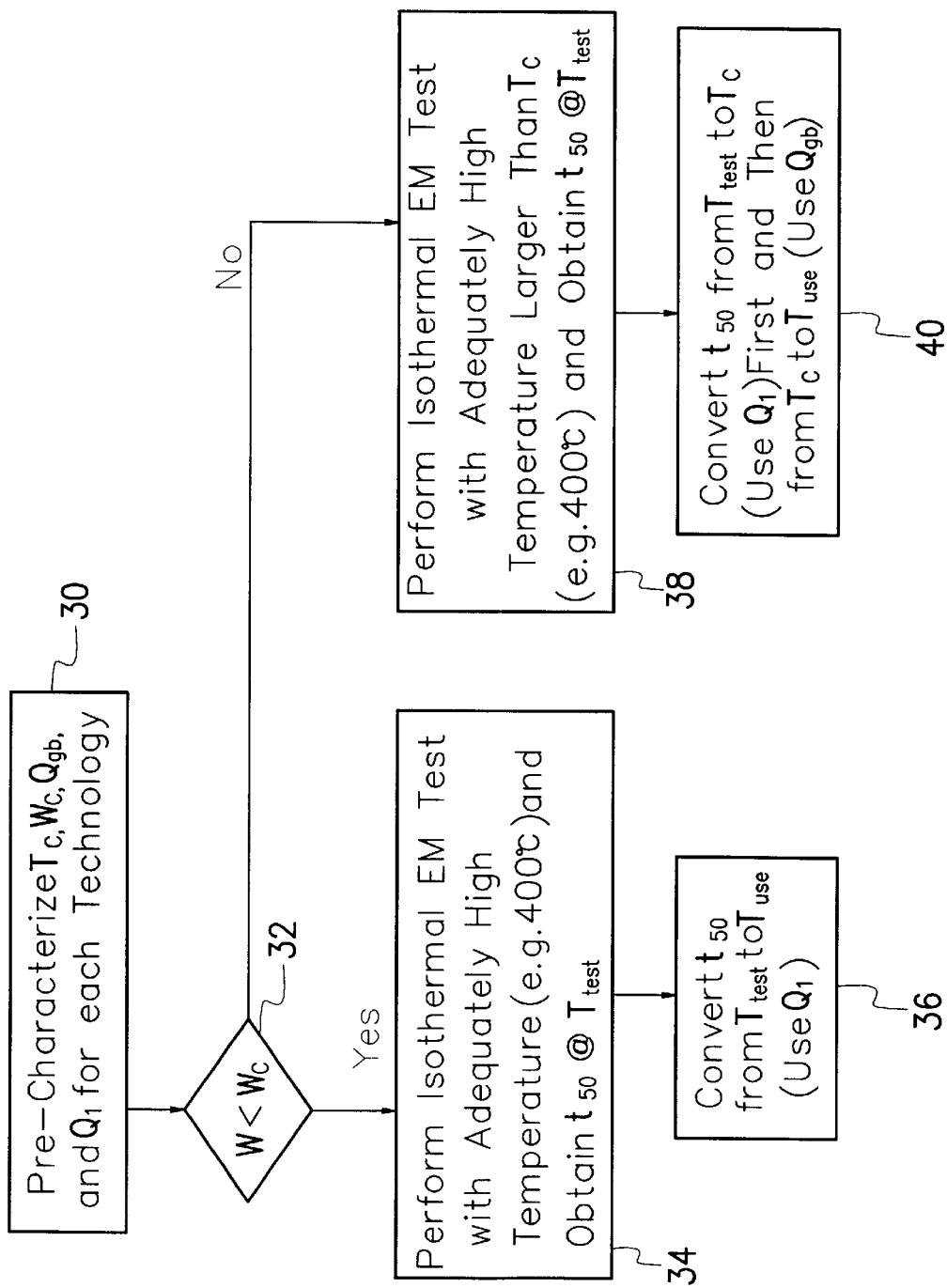
FIG. 4 is a flow chart describing one preferred embodiment of this invention.

As shown in FIGS. 2 and 3, for line widths in the range of W>$W_C$ the extracted $T_C$'s are close to about 390° C. Note that there exists a "gray area" which divides the diffusion regions between 1 μm and 1.2 μm due to finite increments in line width and thus Wc cannot be determined precisely. One can choose the minimum value of the "gray area" as a conservative $W_C$.

Based on what described above, the EM fWLR test can be done depending on the width of the line under test. The test methodology for EM fWLR according to this invention is illustrated in the following description.

FIG. 5 shows the flow chart of the testing method of EM lifetime according to this invention. Referring to FIG. 5, step 30 is performed to pre-characterize $T_C$, $W_C$, $Q_{GB}$ and $Q_L$ for each technology. $T_C$, $W_C$, $Q_{GB}$, and $Q_L$ are probably technology-dependent and hence need to be pre-characterized prior to the use of the test methodology for this invention. It is believed that only one pre-characterization is necessary.

Next, step 32 is performed to compare the real line width (W) with the critical line width ($W_C$). If the real line width (W) is smaller than the critical line width ($W_C$), then step 34 performs an isothermal EM test with an adequate test temperature $T_{test}$, (e.g. 400° C.) and obtains a first EM lifetime($t_{test}$). Then, step 36 is performed, and $t_{50}$ can be directly extrapolated to the normal operating condition by taking the ration of Eq. (5) and is given by equation (2).

$$t_{use} = t_{test}\left(\frac{j_{use}}{j_{test}}\right)^{-2} \exp\left(\frac{Q_L}{k}\left(\frac{1}{T_{use}} - \frac{1}{T_{test}}\right)\right), \quad (2)$$

where the subscropt "use" and "test" correspond to the normal operating condition and the experimental test condition, respectively.

If the real line width (W) is wider than the critical line width ($W_C$), then step 38 is performed. An isothermal EM test is performed with adequately high temperature larger than $T_C$ (e.g. 400° C.) and $t_{50}$ is obtained at temperature $T_{test}$.

Next, step 40 is performed. If $T_{use}$ is larger than $T_C$, then the calculation of $t_{50use}$ is similar to that for the case of W<$W_C$ and Eq.(2) can be used. The equation is thus labeled to Eq.(1a).

$t_{use}=$ $$t_{use} = t_{test}\left(\frac{j_{use}}{j_{test}}\right)^{-2} \exp\left(\frac{Q_L}{k}\left(\frac{1}{T_{use}} - \frac{1}{T_{test}}\right)\right), \quad (1a)$$

for $W > W_C$ and $T_{use} > T_C$;

for $W > W_C$ and $T_{use} > T_C$ \quad (1a)

If $T_{use}$ is smaller than $T_C$, then two steps procedure calculation should be considered. First, $t_{50}$ under $T_C$ is obtained by using Eqs (1b-1), and then $t_{50}$ is converted from $T_C$ to $T_{use}$ by using Eq(1b-2) expcept replacing $Q_L$ by $Q_{GB}$. The equation is thus changed to $$t_{use} = t_{test}\left(\frac{j_{use}}{j_{test}}\right)^{-2} \exp\left(\frac{Q_L}{k}\left(\frac{1}{T_C} - \frac{1}{T_{test}}\right)\right), \quad (1b-1)$$

$$t_{use} = t_{test}\left(\frac{j_{use}}{j_{test}}\right)^{-2} \exp\left(\frac{Q_{QB}}{k}\left(\frac{1}{T_{use}} - \frac{1}{T_C}\right)\right), \quad (1b-2)$$

the 2-step procedure can be reduced to 1-step by taking the ratio of Eq. (1b-1) and Eq. (1b-2). The resulting equation is given by the following:

$$t_{50use} = t_{test}\left(\frac{j_{use}}{j_{test}}\right)^{-n} \exp\left(\frac{Q_{GB}}{k}\left(\frac{1}{T_{use}} - \frac{1}{T_C}\right) - \frac{Q_L}{k}\left(\frac{1}{T_C} - \frac{1}{T_{test}}\right)\right) \quad (1c)$$

for $T < T_C$ and $W > W_C$;

This invention has the following advantages:

1. An isothermal EM test with a full understanding of EM's diffusion mechanism over a wide range of line width and temperature is used.
2. Test time is predictable and can be as small as a few seconds since the Ttest is set at a relatively high temperature such as 400° C.
3. The lifetime under operating conditions can be predicted.

Although this method of testing EM lifetime is based on experimental results for Al, this method can also be used for Cu.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of testing EM lifetime used for estimating the EM lifetime of a metal at an used temperature ($T_{use}$), wherein the metal has a critical line-width ($W_C$), a critical temperature ($T_C$), a lattice diffusion activation energy ($Q_L$) and a grain boundary diffusion activation ($Q_{GB}$), which method comprises:

performing an isothermal EM test step at a test temperature ($T_{test}$) to obtain a first EM lifetime ($t_{test}$), wherein the test temperature ($T_{test}$) is higher than the critical temperature ($T_C$); and substituting the used temperature ($T_{use}$), the lattice diffusion activation energy ($Q_L$), the test temperature ($T_{test}$) and the first EM lifetime ($t_{test}$) into equation (1a) to obtain a real EM lifetime ($t_{use}$) if the metal has a real line width (W) larger than the critical line width ($W_C$) and the used temperature ($T_{use}$) is higher than the critical temperature ($T_C$);

substituting the critical temperature ($T_C$), the lattice diffusion activation energy ($Q_L$), the test temperature ($T_{test}$), the grain boundary diffusion activation energy ($Q_{GB}$), the used temperature ($T_{use}$) and the first EM lifetime ($t_{test}$) into equation (1c) to obtain a real EM lifetime ($t_{use}$) if the metal has a real line width (W) larger than the critical line width ($W_C$) and a used temperature ($T_{use}$) lower than the critical temperature ($T_C$);

substituting the critical temperature ($T_C$), the lattice diffusion activation energy ($Q_L$), the test temperature ($T_{test}$), the used temperature ($T_{use}$) and the first EM lifetime ($t_{test}$) into equation (2) to obtain a real EM lifetime ($t_{use}$) if the metal has a real line width (W) smaller than the critical line width ($W_C$); wherein equations (1a),(1c) and (2) are shown as follows:

$$t_{50use} = t_{test}\left(\frac{j_{use}}{j_{test}}\right)^{-n} \exp\left(\frac{Q_L}{k}\left(\frac{1}{T_{use}} - \frac{1}{T_{test}}\right)\right) \quad (1a)$$

for $T > T_C$ and $W > W_C$;

$$t_{50use} = t_{test}\left(\frac{j_{use}}{j_{test}}\right)^{-n} \exp\left(\frac{Q_{GB}}{k}\left(\frac{1}{T_{use}} - \frac{1}{T_C}\right) - \frac{Q_L}{k}\left(\frac{1}{T_C} - \frac{1}{T_{test}}\right)\right) \quad (1c)$$

for $T < T_C$ and $W > W_C$;

$$t_{50use} = t_{test}\left(\frac{j_{use}}{j_{test}}\right)^{-n} \exp\left(\frac{Q_L}{k}\left(\frac{1}{T_{use}} - \frac{1}{T_{test}}\right)\right) \quad (2)$$

for $W \leq W_C$;

wherein j is a current density, n is a constant.

2. The method of claim 1, wherein the constant n equals to 2.

3. The method of claim 1, wherein the metal comprises Al.

4. The method of claim 3, wherein the critical temperature ($T_C$) is about 390° C.

5. The method of claim 3, wherein the critical line width is about 1 micron for a 0.25 µm process.

6. The method of claim 3, wherein the lattice diffusion activation energy is about 1.05 eV.

7. The method of claim 3, wherein the grain boundary diffusion activation energy is about 0.60 eV.

8. The method of claim 1, wherein the metal comprises Cu.

9. The method of claim 1, wherein before the testing method is performed, a pre-characterizing step is carried out to obtain the critical line-width ($W_C$), the critical temperature ($T_C$), the lattice diffusion activation energy ($Q_L$) and the grain boundary diffusion activation ($Q_{GB}$).

* * * * *